United States Patent

Lien et al.

[11] Patent Number: 5,830,789
[45] Date of Patent: Nov. 3, 1998

[54] CMOS PROCESS FORMING WELLS AFTER GATE FORMATION

[75] Inventors: Chuen-Der Lien, Los Altos Hills; Jeong Yeol Choi, Palo Alto, both of Calif.

[73] Assignee: Integrated Device Technology, Inc., Santa Clara, Calif.

[21] Appl. No.: 751,464

[22] Filed: Nov. 19, 1996

[51] Int. Cl.$^6$ ............................................. H01L 21/8238
[52] U.S. Cl. ........................ 438/217; 438/227; 438/231; 438/232
[58] Field of Search .................................. 438/217, 227, 438/228, 230–233, 168, 216

[56] References Cited

U.S. PATENT DOCUMENTS

| | | |
|---|---|---|
| 3,670,403 | 6/1972 | Lawrence et al. . |
| 4,244,752 | 1/1981 | Henderson et al. ...................... 148/1.5 |
| 4,306,916 | 12/1981 | Wollesen et al. ......................... 148/1.5 |
| 4,398,964 | 8/1983 | Makwah . |
| 4,914,048 | 4/1990 | Scovell et al. ........................... 438/233 |
| 5,045,900 | 9/1991 | Tamagawa . |
| 5,102,816 | 4/1992 | Manukonda et al. ...................... 437/44 |
| 5,268,324 | 12/1993 | Aitken et al. .............................. 437/57 |
| 5,283,203 | 2/1994 | Gill et al. ................................. 438/233 |
| 5,350,941 | 9/1994 | Madan . |
| 5,455,190 | 10/1995 | Hsu . |
| 5,489,540 | 2/1996 | Liu et al. ................................. 438/231 |
| 5,498,891 | 3/1996 | Sato . |
| 5,512,498 | 4/1996 | Okamoto ................................. 438/228 |

FOREIGN PATENT DOCUMENTS 62-149163  7/1987  Japan ..................................... 438/217
234201  11/1994  Taiwan .

OTHER PUBLICATIONS

H. Mikoshiba et al., 1986 Symp. VLSI Technol., p. 41, "A novel CMOS process utilizing after gate implantation process" May 1986.

Nagisetty, R. et al., "A Novel Self–Aligned Punchthrough Implant: A Simulation Study", *IEEE Transactions on Electron Devices* 43:1312–1314 (1996) (no month).

*Primary Examiner*—Trung Dang
*Assistant Examiner*—Leon Radomsky
*Attorney, Agent, or Firm*—Skjerven, Morrill, MacPherson, Franklin & Friel

[57] ABSTRACT

A substrate has defined therein one or more active regions. A layer of polysilicon is deposited and patterned to form gates for various CMOS devices. A masking layer is then deposited and selectively etched to leave exposed portions of the substrate. Dopants of a first conductivity type are implanted into the exposed portions of the substrate to form one or more well regions of the first conductivity type. Using this masking layer and the polysilicon gates left exposed thereby as a mask, dopants of a second conductivity type are then implanted into the substrate to form source and drain regions of the second conductivity type in the well regions of the first conductivity type. The masking layer is then removed. In this manner, source and drain regions may be formed using the same masking layer used to define the well within which the source and drain regions lie, thereby reducing both time and expense in the fabrication of CMOS devices.

11 Claims, 7 Drawing Sheets

5,830,789

CMOS PROCESS FORMING WELLS AFTER GATE FORMATION

BACKGROUND

1. Field of the Invention

This invention relates generally to a method for forming semiconductor devices using fewer masking steps and specifically to a method for forming CMOS devices in which well regions are formed subsequent to the formation of the gates.

2. Description of Related Art

As the semiconductor industry becomes more competitive, it is advantageous to reduce the cost and time required to form semiconductor devices. One manner in which the time and cost associated with the fabrication of semiconductor devices may be reduced is to reduce the number of masking steps employed to form the semiconductor devices.

Referring to FIG. 1A, in a typical prior art CMOS process used to fabricate a semiconductor structure 1, first masking and doping steps are employed to form an N-well 10 and a P-well 12 in, for instance, a P type silicon substrate 14. This is followed by the formation of field oxide regions 16 at the top surface of substrate 14 using, for instance, a well known LOCOS process. Note that in some CMOS processes N-well 10 and P-well 12 may be formed subsequent to the formation of field oxide regions 16.

Referring to FIG. 1B, a layer of gate oxide 18 of suitable thickness is formed over the top surface of substrate 14. A layer of polysilicon is then deposited and patterned in a well known manner to form gates 20A and 20B over N-well 10 and P-well 12, respectively.

As shown in FIG. 1C, a layer of photoresist 22 is formed over a portion of substrate 14 so as to mask P-well 12. Dopants such as boron or boron diflouride ions are then implanted into N-well 10 to form P+ source/drain regions 24, 26 self-aligned to gate 20A, as shown in FIG. 1C. Masking layer 22 is then removed.

Referring now to FIG. 1D, a layer of photoresist 28 is formed over a portion of substrate 14 so as to mask N-well 10. Dopants such as phosphorus ions are then implanted into P-well 12 to form N+ source/drain regions 30, 32 self-aligned to gate 20B, as shown in FIG. 1D. Masking layer 28 is then removed. The remainder (not shown) of structure 1 such as contacts to source/drain regions, metal or polysilicon interconnect layers and insulation layers is then fabricated using well known CMOS technology.

The above described conventional CMOS process typically requires ten or more masking steps and, thus, requires the fabrication of at least ten separate masks. It would be advantageous to modify the above described process in order to reduce the number of masking steps.

SUMMARY

In accordance with the present invention, the number of masking steps required to fabricate CMOS devices is reduced relative to the prior art. In one embodiment, a method for forming a semiconductor device includes providing a semiconductor substrate having a first region and a second region. A first gate is formed above a first portion of the first region of the semiconductor substrate. A first patterned masking layer is formed above the second region of the semiconductor substrate. A dopant of a first conductivity type is implanted into the first region of the semiconductor substrate to form a first well having the first conductivity type.

The method can further include implanting a dopant having a second conductivity type opposite the first conductivity type into portions of the first well to form a first semiconductor region and a second semiconductor region in the first well, the first semiconductor region and the second semiconductor region having the second conductivity type. The first and second semiconductor regions can be source and drain regions of a metal oxide semiconductor (MOS) transistor. In this manner, source and drain regions may be formed using the same masking layer used to define the well within which the source and drain regions lie, thereby reducing both the time and the expense associated with the fabrication of CMOS devices.

DETAILED DESCRIPTION

Figure 1A:
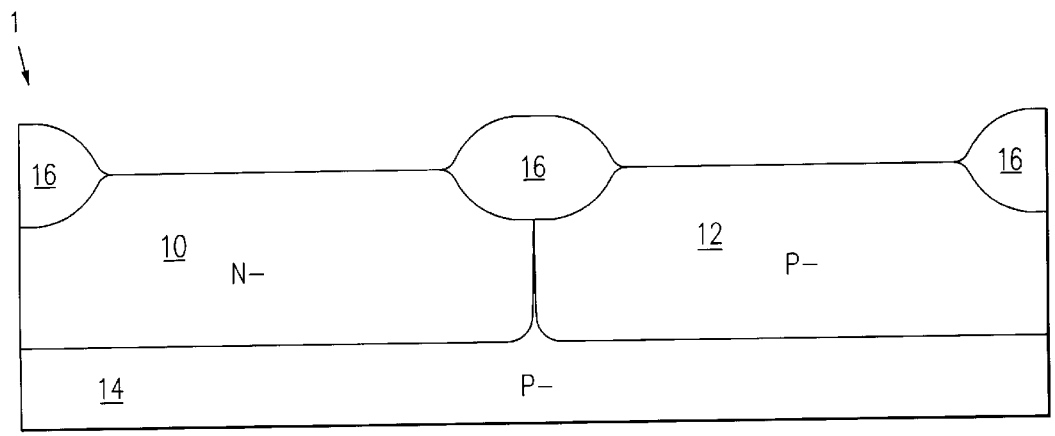
FIGS. 1A, 1B, 1C and 1D are cross-sectional views of a semiconductor structure illustrating broadly various steps of a conventional prior art CMOS process technology.
Figure 1B:
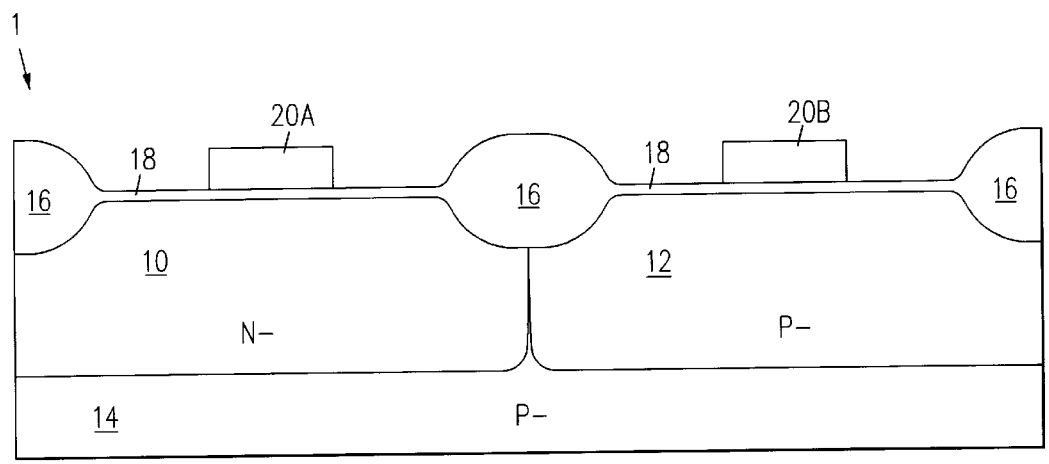
Figure 1C:
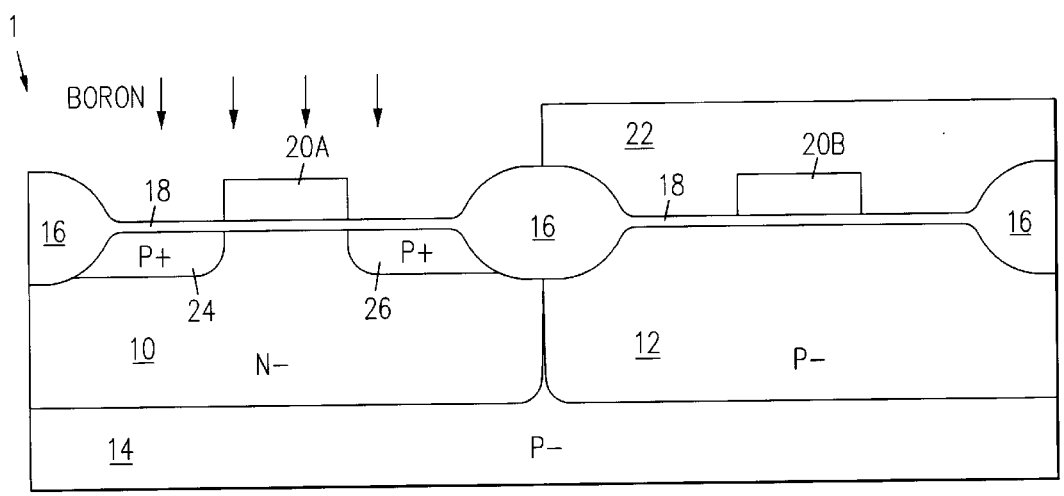
Figure 1D:
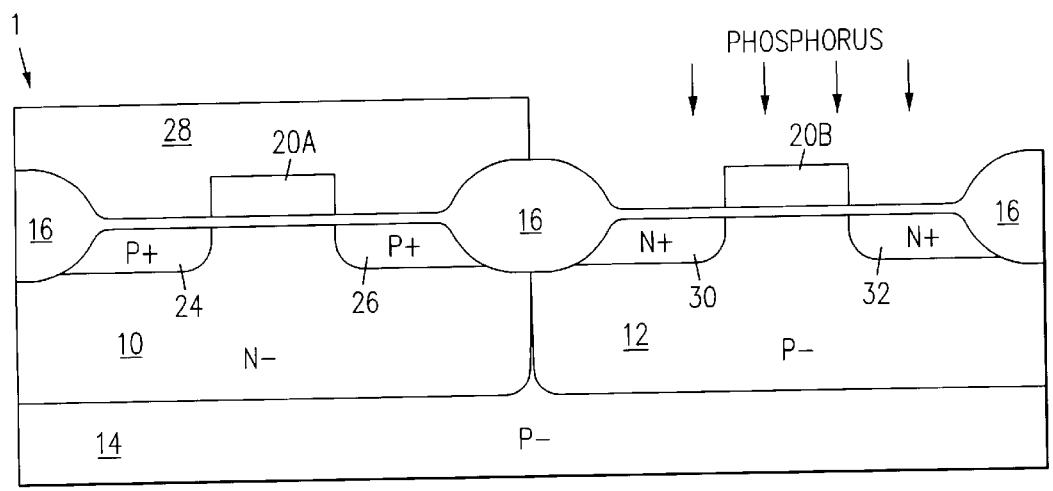
Figure 2:
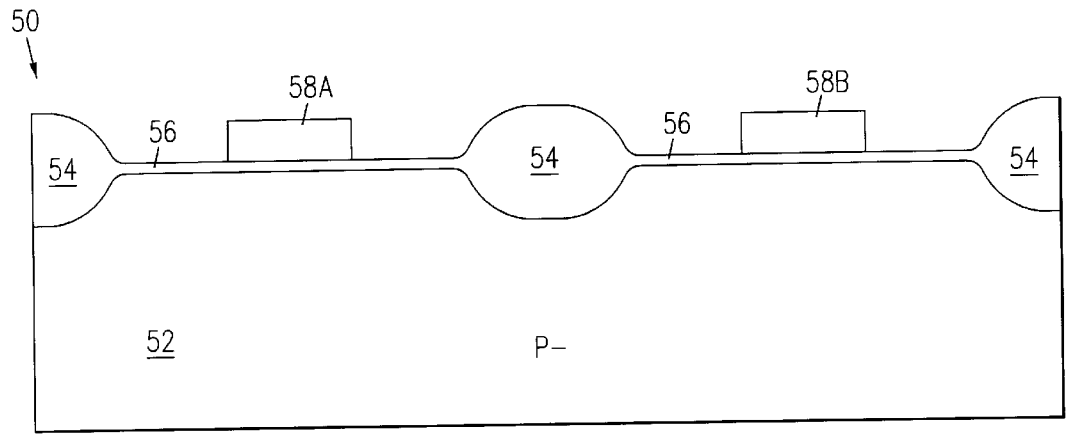
FIGS. 2, 3, 4, 5 and 6 are cross-sectional views of a semiconductor structure illustrating various steps in the fabrication thereof in accordance with one embodiment of the present invention.

In accordance with one embodiment of the present invention, a method of fabricating a semiconductor structure is presented. Referring first to FIG. 2, a semiconductor structure 50 includes a P type silicon substrate 52 having a conductivity suitable for desired operating characteristics. Field oxide regions 54 are formed at the top surface of substrate 52 using a well known LOCOS process or other suitable technique. After a layer of gate oxide 56 is formed, typically thermally grown, above the top surface of substrate 52, a layer of polysilicon is deposited and patterned in a well known manner to form gates 58A and 58B.

Figure 3:
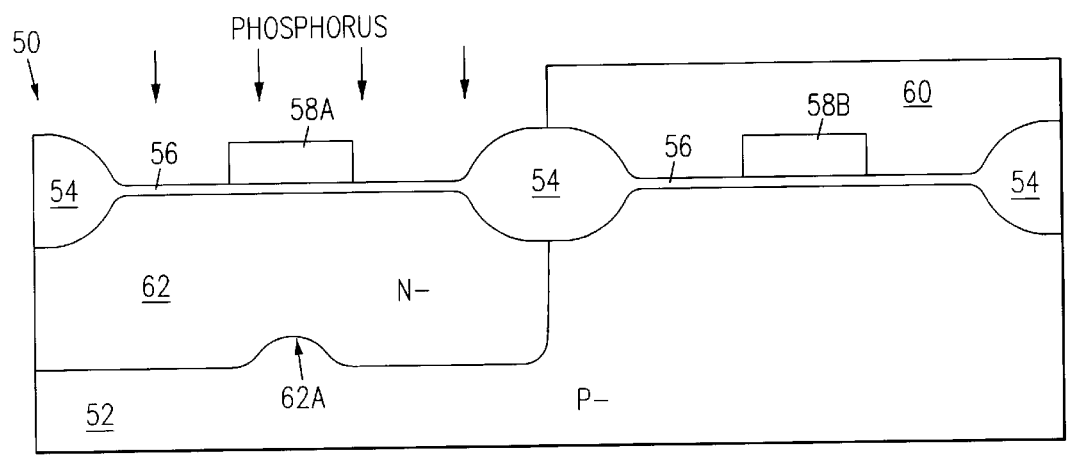

Referring now to FIG. 3, a masking layer 60 of suitable material, typically photoresist, is formed and patterned in a well known manner above a first portion of substrate 52 and above gate 58B. N type dopants such as phosphorus ions are then implanted using one or more implantations into the second portion of substrate 52 to form an N-well 62. For example, phosphorus ions are implanted using between two and four implantations performed at various energies between approximately 200 keV to 1000 keV, and at dosages of between approximately 1E12 ions/cm$^2$ to 1E14 ions/cm$^2$ to form N-well 62. Illustratively, these implantations may include shallow implantations to control threshold voltage, punchthrough and isolation characteristics and/or deep implantations for latch-up suppression.

The N type dopants are implanted with an energy sufficient to pass a portion of the N type dopants through gate 58A and into the underlying substrate 52. Note that due to the partial masking effected by gate 58A, i.e. due to the loss of energy experienced by the impurity ions being implanted as they pass through gate 58A, N-well 62 is slightly shallower in a portion 62A of N-well 62 which underlies gate 58A. In some embodiments, portion 62A of N-well 62 is between 0.2 micrometers ($\mu$m) to 0.3 $\mu$m shallower than the portions of N-well 62 which do not underlie gate 58A.

Figure 4:
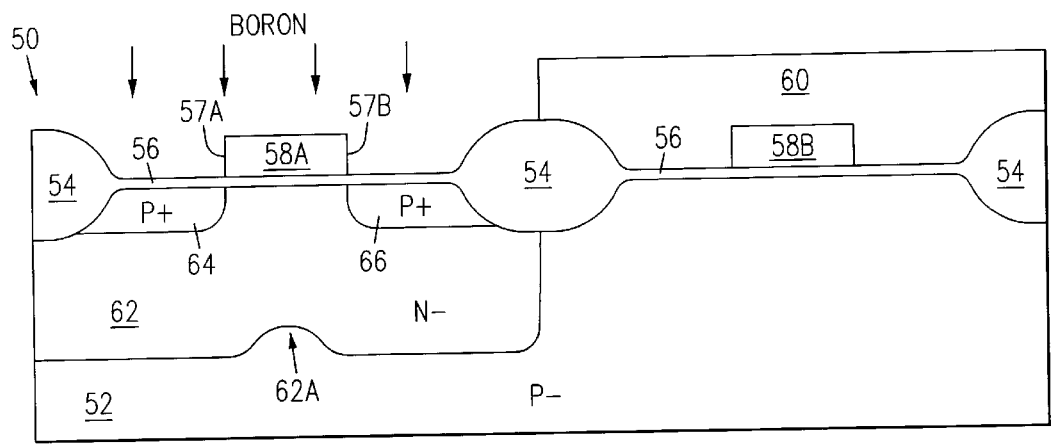

Referring now to FIG. 4, P type dopants such as boron or boron diflouride ions (BF$_2$+) are implanted into portions of N-well 62 to form P+ source/drain regions 64, 66 in N-well 62. For example, boron ions are implanted at an energy of approximately 10 keV and a dosage of approximately 1E15 ions/cm$^2$. The P type dopants do not pass through gate 58A and into the underlying channel portion of N-well 62. Thus, P+ source/drain regions 64, 66 are laterally aligned (self-aligned) with edges 57A, 57B of gate 58A, respectively, as shown in FIG. 4. Masking layer 60 is then removed.

In an alternative embodiment, the above described process steps are reversed while still employing a single masking step, i.e., P+ source/drain regions 64, 66 are formed prior to the formation of N-well 62 using masking layer 60. In this embodiment, after masking layer 60 is formed, P type dopants are implanted as shown in FIG. 4 to form P+ source/drain regions 64, 66. Then N type dopants are implanted as shown in FIG. 3 to form N-well 62. Masking layer 60 is then removed.

Figure 5:
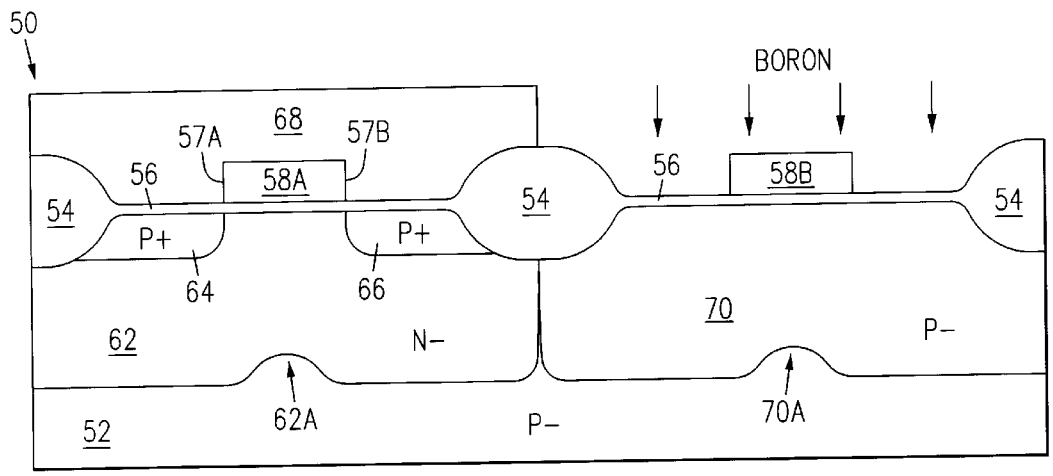

Referring now to FIG. 5, a masking layer 68 of suitable material, typically photoresist, is formed and patterned above N-well 62 and above gate 58A in a well known manner. P type dopants such as boron ions are then implanted using one or more implantations into the first portion of substrate 52 to form a P-well 70. For example, boron ions are implanted using between two and four implantations performed at various energies between approximately 100 keV to 1000 keV and at dosages of between approximately 1E12 ions/cm$^2$ to 1E14 ions/cm$^2$ to form P-well 70. Illustratively, these implantations may include shallow implantations to control threshold voltage, punchthrough and isolation characteristics and/or deep implantations for latch-up suppression.

The P type dopants are implanted with an energy sufficient to pass a portion of the P type dopants through gate 58B and into the underlying portion of substrate 52. For reasons similar to those discussed above in regards to portion 62A of N-well 62, P-well 70 is slightly shallower in a portion 70A of P-well 70 which underlies gate 58B due to the partial masking of gate 58B.

Figure 6:
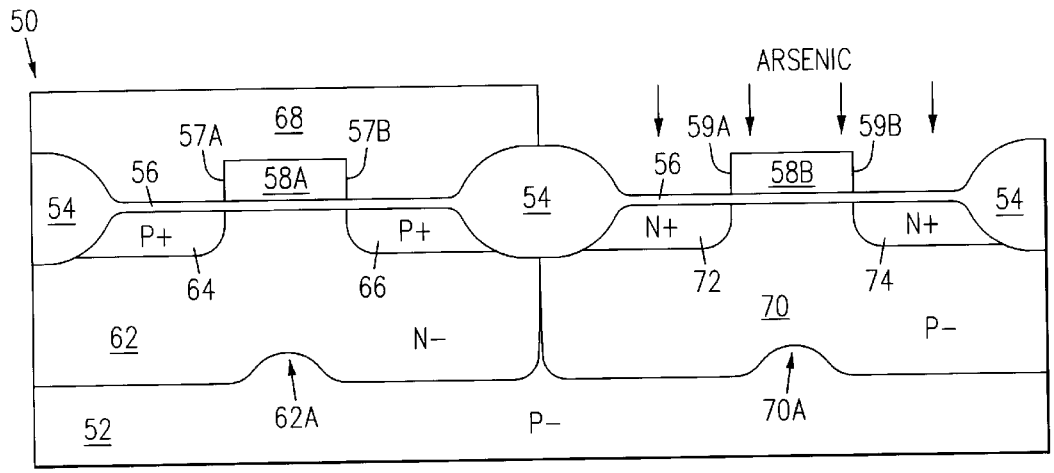

Referring now to FIG. 6, N type dopants such as arsenic ions are implanted into portions of P-well 70 to form N+ source/drain regions 72, 74 in P-well 70. For example, arsenic ions are implanted at an energy of approximately 80 keV and a dosage of approximately 5E15 ions/cm$^2$. The N type dopants do not pass through gate 58B and into the underlying channel portion of P-well 70. Thus, N+ source/drain regions 72, 74 are laterally aligned (self-aligned) with edges 59A, 59B of gate 58B, respectively, as shown in FIG. 6. Masking layer 68 is then removed.

In an alternative embodiment, N+ source/drain regions 72, 74 are formed prior to the formation of P-well 70 using masking layer 68. In this embodiment, after masking layer 68 is formed, N type dopants are implanted as shown in FIG. 6 to form N+ source/drain regions 72, 74. Then P type dopants are implanted as shown in FIG. 5 to form P-well 70. Masking layer 68 is then removed.

Conventional processing techniques are now used to complete fabrication (i.e., the forming of contact regions, the deposition of interconnect layers, the forming of insulating layers, and so on) of the NMOS and PMOS transistors in structure 50. Note that particular dopant concentrations and implant energies provided above, as well as the final resistivities of various layers formed in structure 50, may vary according to desired operating characteristics, thus the values described are illustrative only and not limiting.

The fabrication of structure 50 as described above requires fewer masking steps than conventional methods used to fabricate CMOS structures. In accordance with this invention, in the formation of a PMOS device, N-well 62 (See FIG. 4) and P+ source/drain regions 64, 66 are formed using a single mask, i.e., masking layer 60. Similarly, in accordance with this invention, in the formation of an NMOS device, P-well 70 (see FIG. 6) and N+ source/drain regions 72, 74 are formed using a single mask, i.e., masking layer 68. In this manner, CMOS devices are fabricated using a fewer number of masks than in the prior art, thereby saving both time and expense.

Figure 7:
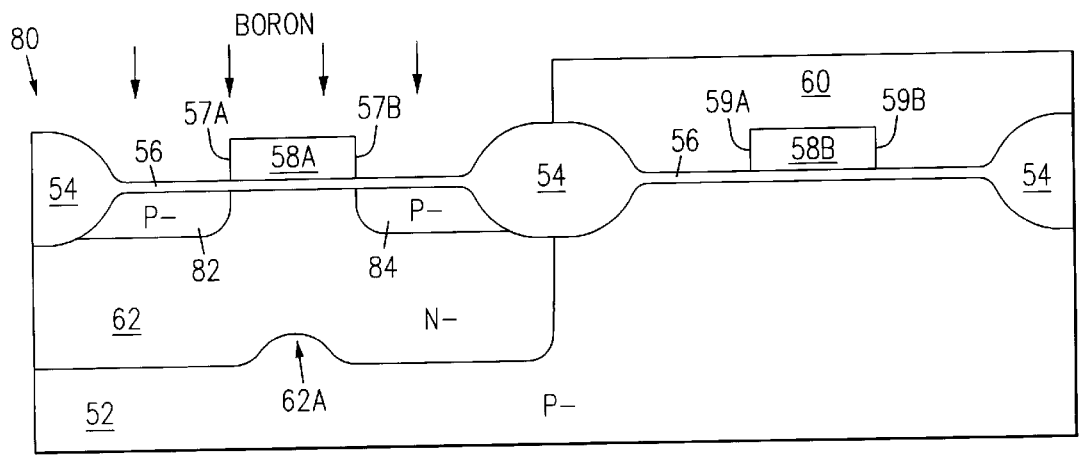
FIGS. 7, 8 and 9 are cross-sectional views of a semiconductor structure illustrating various steps in the fabrication thereof in accordance with another embodiment of the present invention.

Lightly doped drain (LDD) devices may be formed in accordance with the present invention by slightly modifying the above-described process. For instance, the P type dopant implantation illustrated in FIG. 4 to form P+ source/drain regions 64, 66 can be performed using a lower dosage to form lightly-doped P– source/drain regions 82, 84 within N-well 62, as shown in FIG. 7. For example, boron ions are implanted at an energy of 10 keV and at a dosage of approximately 1E12 ions/cm$^2$ to 1E13 ions/cm$^2$ into portions of N-well 62 to form P– source/drain regions 82, 84. Since a lower dosage is used, P– source/drain regions 82, 84 have a lower dopant concentration than the dopant concentration of P+ source/drain regions 64, 66 (FIG. 4). Since the P type dopant does not pass through gate 58A and into the underlying channel portion of N-well 62, P– source/drain regions 82, 84 are laterally aligned (self-aligned) with edges 57A, 57B of gate 58A, respectively, as shown in FIG. 7. Components common to structures 50 (FIG. 4) and 80 (FIG. 7) are appropriately labelled with the same numerals.

Figure 8:
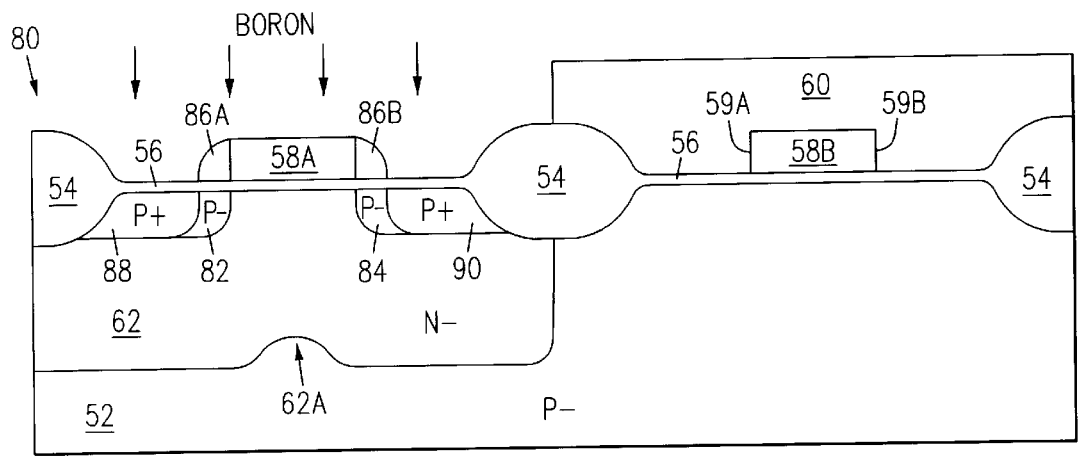

Referring now to FIG. 8, sidewall spacers 86A and 86B are then formed adjacent to edges 57A and 57B of gate 58A, respectively, in a well known manner. In a subsequent doping step, P type dopants such as boron ions are implanted into portions of N-well 62 to form P+ source/drain regions 88, 90 in N-well 62. Typically, the dosage used in the P type dopant implantation of FIG. 8 is greater than the dosage used in the P type dopant implantation of FIG. 7. For example, the P type dopant implantation of FIG. 8 is performed using an energy of approximately 10 keV and a dosage of approximately 1E15 ions/cm$^2$. Accordingly, the dopant concentration of P+ source/drain regions 88, 90 is greater than the dopant concentration of P– source/drain regions 82, 84.

The P type dopants used to form P+ source/drain regions 88, 90 do not pass through gate 58A or the thicker portions of sidewall spacers 86A, 86B and into the underlying portions of N-well 62. (Depending upon the implant energy used, the P type dopant may not pass through any portions of sidewall spacers 86A, 86B). Thus P+ source/drain regions 88, 90 are laterally aligned (self-aligned) with sidewall spacers 86A, 86B, respectively, as shown in FIG. 8. Masking layer 60 is then removed. Here, N-well 62, lightly-doped P– source/drain regions 82, 84, and P+ source/drain regions 88, 90 are formed using one masking layer, i.e., masking layer 60.

Figure 9:
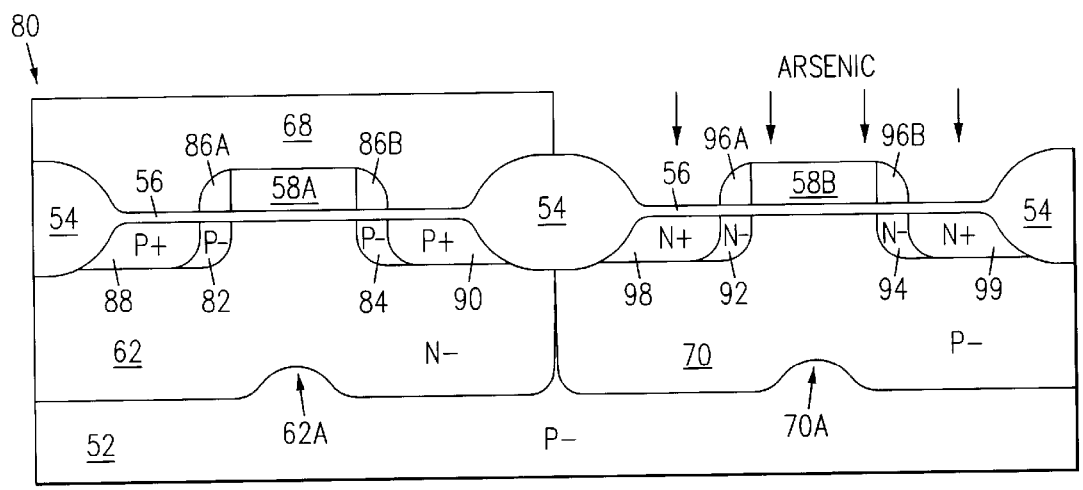

NMOS LDD devices may be formed in a similar manner. Referring to FIG. 9, masking layer 68 is formed and patterned in a well known manner over a portion of substrate 52, over gate 58A, sidewall spacers 86A, 86B and in particular over N-well 62. P type dopants such as boron ions are implanted using one or more implantations (not shown), for example during between two and four implantations performed at various energies of between approximately 100 keV to 1000 keV and at dosages of approximately 1E12 ions/cm$^2$ to 1E14 ions/cm$^2$, to form a P-well 70 in a manner consistent with that described earlier with respect to FIG. 5.

N type dopants such as phosphorus ions are then implanted (not shown) into portions of P-well 70, for example at an energy of approximately 40 keV and a dosage of approximately 1E13 to 1E14 ions/cm$^2$, to form lightly-doped N− source/drain regions 92, 94 in P-well 70.

At this point, N− source/drain regions 92, 94 generally have a lower dopant concentration than N+ source/drain regions 72, 74 (FIG. 6), respectively. Sidewall spacers 96A and 96B are then formed adjacent to edges 59A and 59B of gate 58B, respectively, in a well known manner.

N type dopants such as arsenic ions are then implanted, for example at an energy of approximately 80 keV and a dosage of approximately 5E15 ions/cm$^2$, to form N+ source/drain regions 98, 99 in P-well 70, as shown in FIG. 9.

Typically, the dosage of the implantation used to form N+ source/drain regions 98, 99 is greater than the dosage of the implantation used to form N− source/drain regions 92, 94. Accordingly, the dopant concentration of N+ source/drain regions 98, 99 is greater than the dopant concentration of N− source/drain regions 92, 94.

The N type dopants do not pass through gate 58B or the thicker portions of sidewall spacers 96A, 96B and into the underlying portions of P-well 70. (Depending upon the implant energy used, the N type dopant may not pass through any portions of sidewall spacers 96A, 96B). Thus, N+ source/drain regions 98, 99 are laterally aligned (self-aligned) with sidewall spacers 96A, 96B, respectively, as shown in FIG. 9. Masking layer 68 is then removed. Conventional processing techniques are then employed to complete the fabrication of structure 80. Again, note that the formation of P-well 70, lightly-doped N− source/drain regions 92, 94, and N+ source/drain regions 98, 99 is accomplished using only one masking layer 68.

Figure 10:
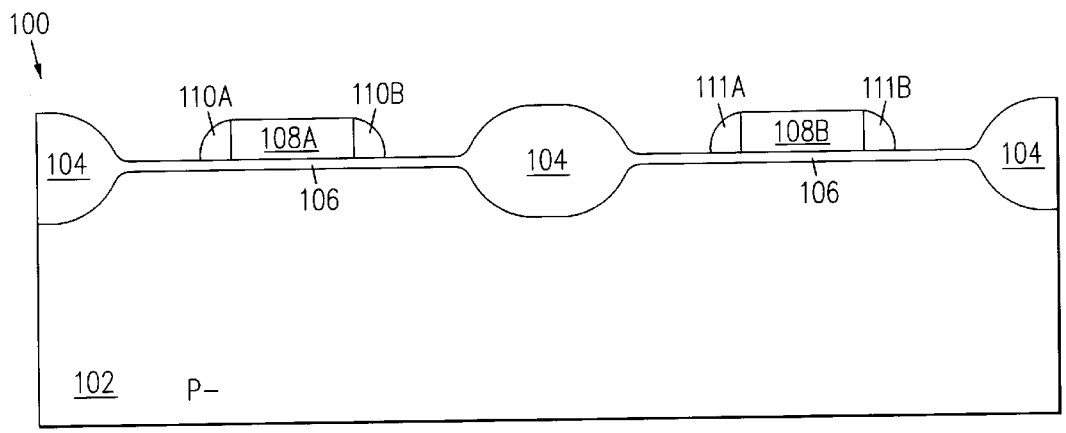
FIGS. 10, 11, 12, 13 and 14 are cross-sectional views of a semiconductor structure illustrating various steps in the fabrication thereof in accordance with yet another embodiment of the present invention.

In accordance with another embodiment of the present invention, the source and drain regions of LDD CMOS structures may be fabricated prior to the formation of their associated well regions. Referring to FIG. 10, structure 100 includes a P type silicon substrate 102 having a conductivity suitable for desired operating characteristics. Field oxide regions 104 are formed at the top surface of substrate 102 using a well known LOCOS process or other suitable technique. After a layer of gate oxide 106 is formed, typically thermally grown, above the top surface of substrate 102, a layer of polysilicon is deposited and patterned in a well known manner to form gates 108A and 108B. Sidewall spacers 110A, 110B and 111A, 111B are then formed adjacent to edges of respective gates 108A and 108B in a well known manner.

Figure 11:
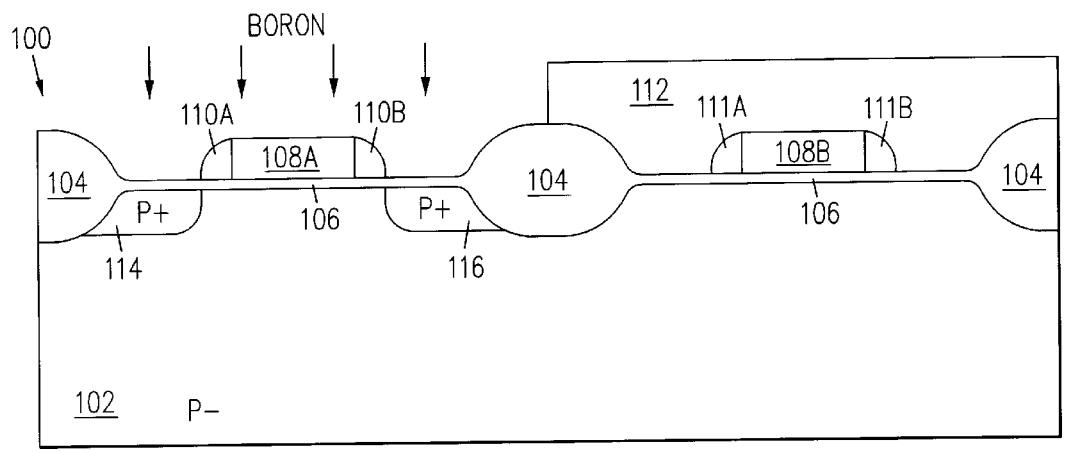

Referring now to FIG. 11, a masking layer 112 of suitable material, typically photoresist, is formed and patterned in a well known manner above a portion of substrate 102, above gate 108B and above sidewall spacers 111A, 111B. P type dopants such as boron ions are then implanted into portions of substrate 102, for example at an energy of approximately 10 keV and a dosage level of approximately 1E15 ions/cm$^2$, to form P+ source/drain regions 114, 116 in substrate 102. The P type dopants do not pass through gate 108A or the thicker portions of sidewall spacers 110A, 110B and into the underlying portions of substrate 102. (Depending on the implant energy used, the P type dopant may not pass through any portions of sidewall spaces 110A, 110B). Thus P+ source/drain regions 114, 116 are laterally aligned (self-aligned) with sidewall spacers 110A, 110B, respectively.

Figure 12:
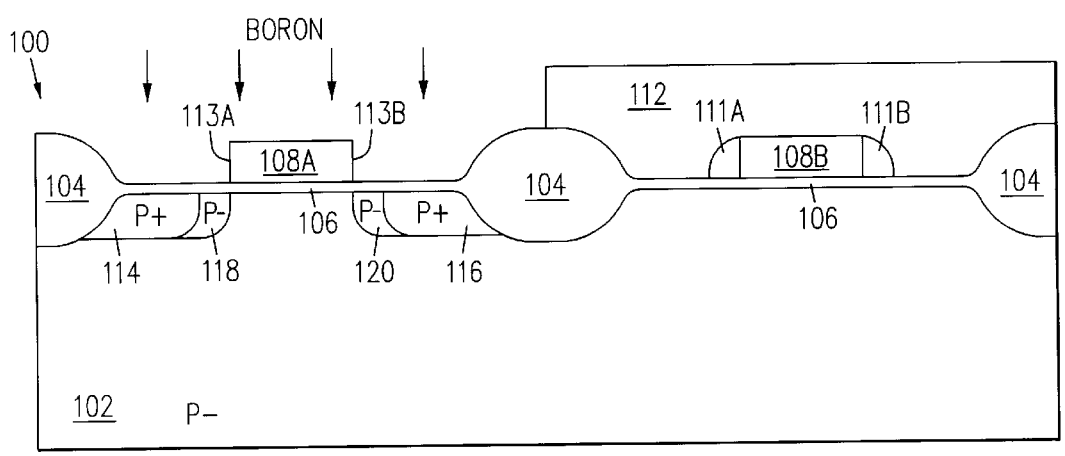

Referring now to FIG. 12, sidewall spacers 110A and 110B are then removed using an appropriate etchant. P type dopants such as boron ions are then implanted into portions of substrate 102, for example at an energy of approximately 10 keV and a dosage of approximately 1E12 to 1E13 ions/cm$^2$, to form lightly-doped P− source/drain regions 118, 120 in substrate 102. The P type dopant does not pass through gate 108A or into the underlying portion of substrate 102. Thus lightly doped P− source/drain regions 118, 120 are laterally aligned (self-aligned) with edges 113A, 113B of gate 108A, respectively.

Figure 13:
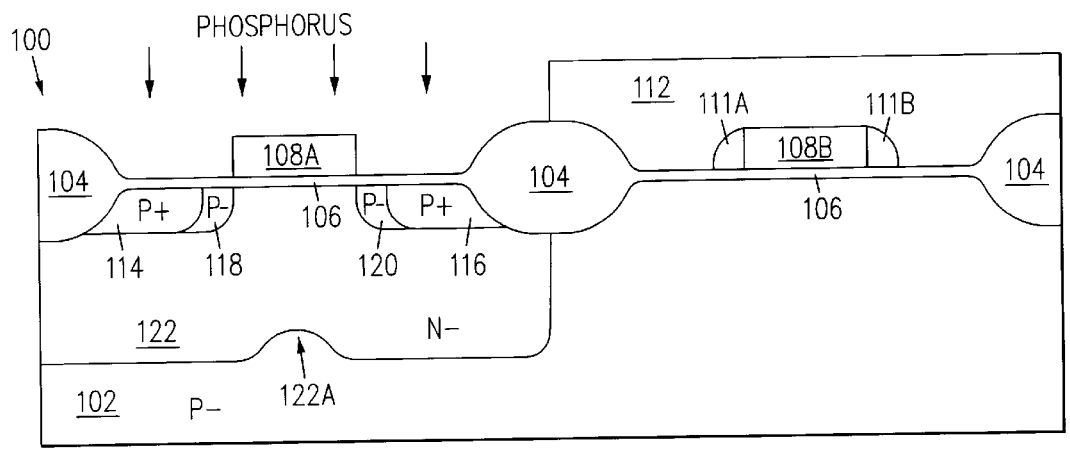

Referring now to FIG. 13, N type dopants such as phosphorus ions are implanted using one or more implantations into a portion of substrate 102 to form an N-well 122. For example, N type dopants are implanted using between two and four implantations performed at various energies between approximately 200 keV to 1000 keV and at dosages of between approximately 1E12 ions/cm$^2$ to 1E14 ions/cm$^2$ to form N-well 122 in substrate 102. The N type dopants have sufficient energy to pass through gate 108A and into the underlying portion of substrate 102. However, because of the partial masking of gate 108A, N-well 122 is slightly shallower in a portion 122A of N-well 122 which underlies gate 108A, as shown in FIG. 13. Masking layer 112 is then removed.

Figure 14:
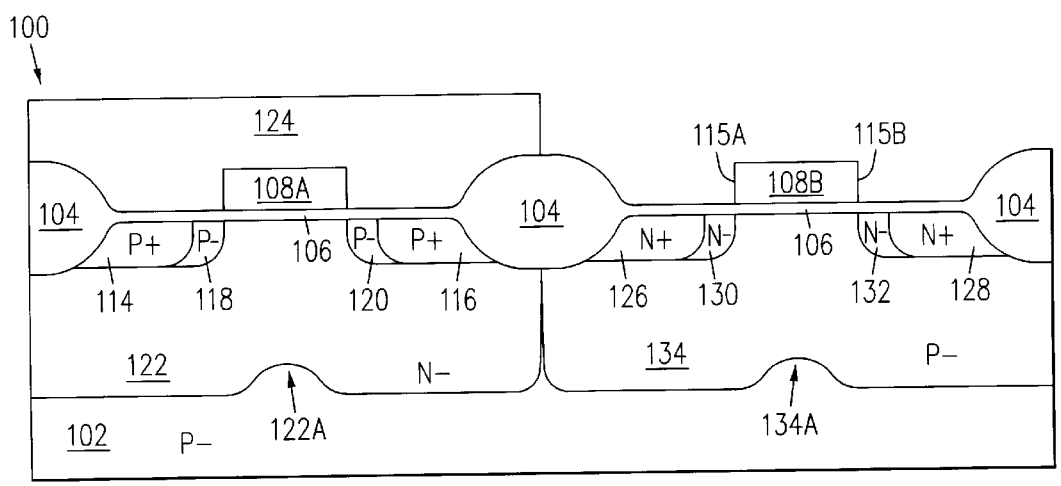

NMOS LDD devices may be formed in a similar manner. Referring to FIG. 14, a masking layer of suitable material 124, typically photoresist, is formed and patterned in a well known manner above a portion of substrate 102, above gate 108A and in particular above N-well 122.

N type dopants such as arsenic ions are then implanted (not shown) into portions of substrate 102, for example at an energy of approximately 80 keV and at a dosage of approximately 1E15 ions/cm$^2$, to form N+ source/drain regions 126, 128 in substrate 102.

The N type dopants do not pass through gate 108B or the thicker portion of sidewall spacers 111A, 111B (see FIG. 13). (Depending upon the implant energy used, the N type dopant may not pass through any portions of sidewall spacers 111A, 111B). Thus, N+ source/drain regions 126, 128 are laterally aligned (self-aligned) with sidewall spacers 111A, 111B, respectively. Sidewall spacers 111A, 111B are then removed using an appropriate etchant.

N type dopants such as phosphorus ions are implanted (not shown) into portions of substrate 102, for example at an energy of approximately 40 keV and at a dosage of approximately 1E13 to 1E14 ions/cm$^2$, to form lightly-doped N− source/drain regions 130, 132 having a lower dopant concentration than N+ source/drain regions 126, 128. Since the N type dopants do not pass through gate 108B and into the underlying portion of substrate 102, N− source/drain regions 130, 132 are laterally aligned (self-aligned) with edges 115A, 115B of gate 108B, respectively.

Next, P type dopants such as boron ions are implanted using one or more implantations (not shown) into a portion of substrate 102, for example during between two and four implantations performed at various energies between approximately 100 keV to 1000 keV and at dosages of between approximately 1E12 ions/cm$^2$ to 1E14 ions/cm$^2$, to form a P-well 134 in substrate 102. A portion of the P type dopants pass through gate 108B and into the underlying portion of substrate 102. However, because of the partial masking of gate 108B, P-well 134 is slightly shallower in a portion 134A of P-well 134 which underlies gate 108B, as shown in FIG. 14. Masking layer 124 is then removed. Conventional processing techniques are now used to complete fabrication (i.e., the forming of contact regions, the deposition of interconnect layers, the forming of insulating layers, and so on) of various NMOS and PMOS transistors in structure 100.

Note that in the above-described embodiments there do not exist within the wells heavily doped regions of the same conductivity type as the wells. That is, the P-wells 70 (FIG. 6) and 134 (FIG. 14) do not contain therein a heavily doped P+ region and, in a similar manner, N-wells 62 (FIG. 6) and 122 (FIG. 14) do not contain therein a heavily doped N+ region. Thus, it may be problematic to electrically contact the well regions using conventional techniques.

Figure 15:
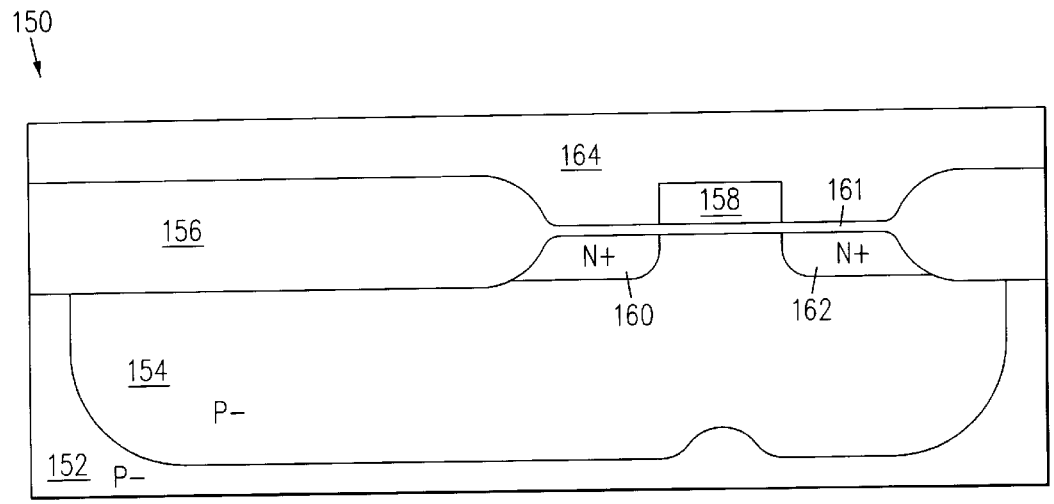
FIGS. 15 and 16 are cross sectional views of a semiconductor structure illustrating various steps in the formation of contact openings in accordance with one embodiment of the invention.

In accordance with the present invention, contacts may be fabricated to well regions formed as described above (and also to well regions formed using conventional techniques) simultaneous with formation of contacts to source and drain regions of the MOS transistors formed in the well regions. FIG. 15 shows a structure 150 including a P type substrate 152 having a P-well 154 and a field oxide region 156 formed at the top surface of substrate 152 overlying a portion of P-well 154. Formed within P-well 154 are N+ source/drain regions 160, 162 of an NMOS transistor. A layer of gate oxide 161 is formed above the top surface of substrate 152 and a gate 158 is formed above gate oxide 161. An insulating layer 164 of, for instance, phosphosilicate glass (PSG) or boron phosphosilicate glass (BPSG) is formed above the top of structure 150 and in particular above field oxide region 156, gate oxide 161 and gate 158.

Figure 16:
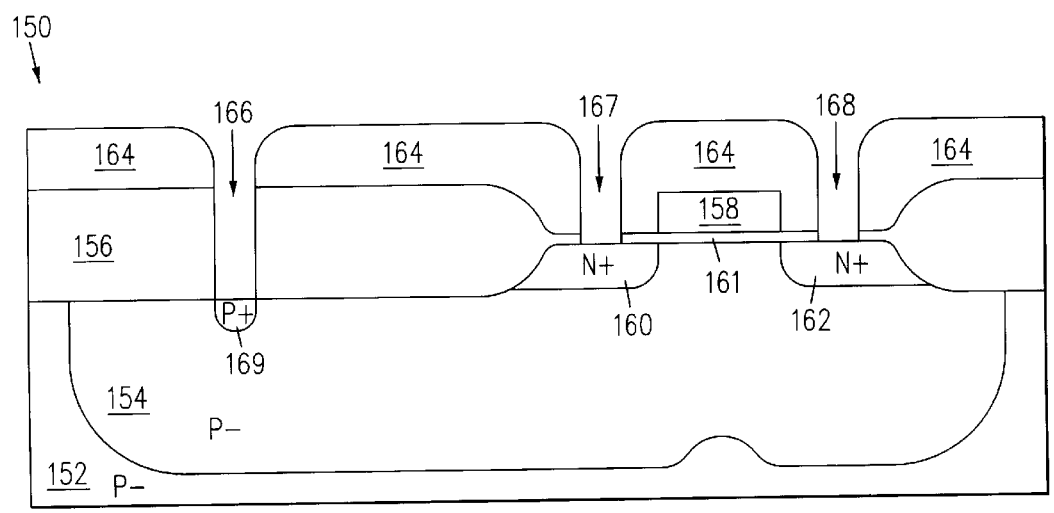

Referring now to FIG. 16, a masking layer (not shown) is formed and patterned to expose portions of insulating layer 164. The exposed portions of insulating layer 164 and the underlying portions of field oxide region 156, gate oxide 161 are then etched to form an opening 166 in insulating layer 164 and field oxide region 156 and openings 167 and 168 in insulating layer 164 and gate oxide 161. Opening 166 extends to P-well 154 and openings 167, 168 extend to N+ source/drain regions 160, 162, respectively. Openings 166, 167 and 168 are filled in subsequent steps with a suitable conductive material such as metal or polysilicon. The conductive material contained in opening 166 serves as a contact to P-well 154, while the conductive material contained in openings 167, 168 serves as contacts to N+ source/drain regions 160, 162, respectively. Note that in optional masking and doping steps a P+ contact region 169 may be formed in that portion of P-well 154 exposed by opening 166 by implanting a P type dopant through opening 166 and into P-well 154. In other embodiments, contacts to N-wells are made in a similar manner.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention.

We claim:

1. A method for forming a semiconductor device, said method comprising the steps of:

providing a semiconductor substrate having a first region and a second region;

forming a first gate above said first region;

forming a first sidewall spacer adjacent a first edge of said first gate and a second sidewall spacer adjacent a second edge of said first gate;

forming a first patterned masking layer above said second region;

implanting a first dopant having a first conductivity type into portions of said first region of said semiconductor substrate to form a first semiconductor region and a second semiconductor region in said first region of said semiconductor substrate;

removing said first spacer and said second spacer;

implanting a second dopant having said first conductivity type into portions of said first region of said semiconductor substrate to form a third semiconductor region and a fourth semiconductor region in said first region of said semiconductor substrate; and subsequent to said step of implanting a first dopant and said step of implanting a second dopant, implanting a third dopant having a second conductivity type into said first region of said semiconductor substrate to form a first well.

2. The method of claim 1 wherein said first semiconductor region and said second semiconductor region are source/drain regions of a metal oxide semiconductor (MOS) transistor.

3. The method of claim 1, further comprising the steps of:

removing said first patterned masking layer;

forming an insulating layer over said semiconductor device, wherein a field oxide region lies intermediate said insulating layer and said first well in a first portion of said device;

forming a second patterned masking layer over said insulating layer to expose a portion of said insulating layer; and etching away said portion of said insulating layer and a portion of said field oxide region to expose a contact region of said first well.

4. The method of claim 3 wherein said insulating layer is selected from the group consisting of boron phosphosilicate glass (BPSG) and phosphosilicate glass (PSG).

5. The method of claim 1, wherein said first gate comprises polysilicon.

6. The method of claim 1, wherein said step of forming said first gate further comprises forming a second gate above said second region of said semiconductor substrate and wherein said step of forming said first sidewall spacer and said second sidewall spacer further comprises forming a third sidewall spacer adjacent a first edge of said second gate and a fourth sidewall spacer adjacent a second edge of said second gate, said method further comprising the steps of:

removing said first patterned masking layer;

forming a second patterned masking layer above said first well and said first gate;

implanting a fourth dopant having said second conductivity type into portions of said second region of said semiconductor substrate to form a fifth semiconductor region and a sixth semiconductor region in said second region of said semiconductor substrate;

removing said third sidewall spacer and said fourth sidewall spacer;

implanting a fifth dopant having said second conductivity type into portions of said second region of said semiconductor substrate to form a seventh semiconductor region and an eighth semiconductor region in said second region of said semiconductor substrate; and implanting a sixth dopant having said first conductivity type into said second region of said semiconductor substrate to form a second well.

7. The method of claim 1 wherein the dopant concentration of said third semiconductor region and said fourth semiconductor region is lower than the dopant concentration of said first semiconductor region and said second semiconductor region.

8. The method of claim 1 wherein said first semiconductor region is laterally aligned with said first sidewall spacer, said second semiconductor region is laterally aligned with said second sidewall spacer, said third semiconductor region is laterally aligned with said first edge of said first gate and said fourth semiconductor region is laterally aligned with said second edge of said first gate.

9. The method of claim 1 wherein a portion of said third dopant passes through said first gate and into a first portion of said first region of said semiconductor substrate underlying said first gate wherein said first well is shallower in said first portion than in other portions of said first well.

10. A method for forming a semiconductor device, said method comprising the steps of:

providing a semiconductor substrate;

forming a gate above a first region of said semiconductor substrate;

forming a first patterned masking layer above a second region of said semiconductor substrate; and implanting a first dopant having a first conductivity type into portions of said first region to form a first semiconductor region and a second semiconductor region;

forming sidewall spacers adjacent edges of said gate;

implanting a second dopant having said first conductivity type into portions of said first region to form a third semiconductor region and a fourth semiconductor region; and subsequent to said step of implanting a first dopant and said step of implanting a second dopant, implanting a third dopant of a second conductivity type into said first region of said semiconductor substrate to form a well.

11. The method of claim 10, further comprising the steps of:

removing said first patterned masking layer;

forming an insulating layer over said semiconductor substrate, wherein a field oxide region lies intermediate said insulating layer and said well;

forming a second patterned masking layer over said insulating layer to expose a portion of said insulating layer; and etching away said portion of said insulating layer and a portion of said field oxide region to expose a contact region of said well.

* * * * *